(12) United States Patent
Hazanchuk et al.

(10) Patent No.: US 7,348,914 B1
(45) Date of Patent: Mar. 25, 2008

(54) METHOD AND SYSTEMS TO ALIGN OUTPUTS SIGNALS OF AN ANALOG-TO-DIGITAL CONVERTER

(75) Inventors: Asher Hazanchuk, Sunnyvale, CA (US); Ian Ing, San Jose, CA (US); Satwant Singh, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/477,759

(22) Filed: Jun. 29, 2006

(51) Int. Cl.
*H03M 1/12* (2006.01)

(52) U.S. Cl. ........................ 341/155; 341/110
(58) Field of Classification Search ............... 341/155, 341/112, 159
See application file for complete search history.

(56) References Cited

U.S. PATENT DOCUMENTS

| | | | | |
|---|---|---|---|---|
| 5,239,560 A | * | 8/1993 | Daniel | 375/260 |
| 5,477,173 A | * | 12/1995 | Schlesselmann et al. | 327/111 |
| 5,870,047 A | * | 2/1999 | Piesinger | 341/143 |
| 6,747,584 B2 | * | 6/2004 | Havelock | 341/143 |
| 6,771,203 B1 | * | 8/2004 | Nairn | 341/159 |
| 6,798,742 B1 | * | 9/2004 | Mawhinney et al. | 370/230 |
| 6,898,742 B2 | * | 5/2005 | Koyanagi et al. | 714/700 |
| 2006/0267812 A1 | * | 11/2006 | Bunin | 341/120 |

OTHER PUBLICATIONS

ADC08D1500, National Semiconductor Corporation, Oct. 2005, 38 pages.
David Marsh, Software-defined radio tunes in, EDN, Mar. 3, 2005, 9 pages.
The Analog Devices Solutions Bulletin, High-Speed Converters, Feb. 2002, 16 pages.

* cited by examiner

*Primary Examiner*—Peguy JeanPierre
(74) *Attorney, Agent, or Firm*—MacPherson Kwok Chen & Heid LLP; Greg J. Michelson (57) ABSTRACT

Systems and methods are disclosed herein to provide improved alignment of output signals of an analog-to-digital converter (ADC). For example, in accordance with an embodiment of the present invention, a method of aligning digital signals appearing on signal paths of a parallel data bus includes sampling the digital signals at a plurality of delay times to obtain a plurality of sample sets, wherein each sample set is associated with a corresponding delay time. A second digital signal that is misaligned with respect to a first digital signal is identified from the sample sets. The delay time required to align the second digital signal with the first digital signal is determined. The delay of the second digital signal is adjusted by the determined delay time.

18 Claims, 6 Drawing Sheets

METHOD AND SYSTEMS TO ALIGN OUTPUTS SIGNALS OF AN ANALOG-TO-DIGITAL CONVERTER

TECHNICAL FIELD

The present invention relates generally to integrated circuits and, more particularly, to the providing of digital signals to integrated circuits.

BACKGROUND

Analog-to-digital converters (ADCs) are frequently used to convert analog signals into digital signals which may be provided to integrated circuits. For example, while receiving an analog input signal, a multi-bit ADC may provide a plurality of corresponding digital output signals over a parallel data bus, where each digital output signal is associated with a corresponding data bit. An integrated circuit coupled to the ADC data bus may periodically sample the individual digital output signals to obtain a digital representation of the original analog signal.

Variations in devices and board layouts can cause the individual digital output signals to exhibit different propagation delays as they pass over the data bus to the integrated circuit. Such delays can cause the digital output signals to be misaligned with each other when received by the integrated circuit. Consequently, the integrated circuit may be prevented from sampling the entire data bus until after all digital output signals have been received.

Integrated circuits such as programmable logic devices (PLDs) (e.g., field programmable gate arrays (FPGAs) or complex programmable logic devices (CPLDs)) may require setup and hold times of several hundred picoseconds when sampling external signals received from, for example, an ADC data bus. Such times can contribute to a further lag time before the integrated circuit may sample the data bus.

When the integrated circuit samples the data bus at relatively low sampling frequencies, the various lag times associated with data bit misalignments and setup and hold times are generally negligible and do not consume significant portions of the sampling period available to the integrated circuit. However, at higher sampling frequencies, the interface between the ADC and the PLD becomes non-trivial.

For example, at sampling frequencies in excess of 1.5 GHz, the available sampling period (i.e., the time between periodic changes in the digital output signals provided by the ADC) can shrink to less than 1 nanosecond. Because a significant portion of the available sampling period can be consumed by setup and hold times of the integrated circuit, any further delays caused by misalignment of the digital output signals can limit the maximum sampling frequency of the integrated circuit. In particular, if the sampling period shrinks to less than several hundred picoseconds, misalignments in the digital output signals from the ADC may prevent the integrated circuit from reliably sampling the ADC data bus.

As a result, there is a need for an improved approach to the providing of digital output signals to integrated circuits to support high sampling frequencies offered by current ADCs.

SUMMARY

In accordance with one embodiment of the present invention, a method of aligning digital signals appearing on signal paths of a parallel data bus includes sampling the digital signals at a plurality of delay times to obtain a plurality of sample sets, wherein each sample set is associated with a corresponding delay time; identifying from the sample sets a second digital signal that is misaligned with respect to a first digital signal; determining the delay time required to align the second digital signal with the first digital signal; and adjusting the delay of the second digital signal by the determined delay time.

In accordance with another embodiment of the present invention, a system for aligning a plurality of signals includes a plurality of input buffers adapted to receive a plurality of digital signals over a data bus, wherein the digital signals are associated with a corresponding plurality of data bits; a plurality of delay blocks associated with the input buffers, wherein each delay block is adapted to individually delay an associated one of the digital signals by a selectable delay time; and means for selecting the delay times of the delay blocks to substantially align the digital signals.

In accordance with another embodiment of the present invention, a method of aligning a plurality of signals includes sampling a plurality of digital signals to obtain a first plurality of samples, wherein the digital signals are associated with a corresponding plurality of data bits; determining a first best fit line function using the first plurality of samples; calculating a first absolute distance between the first plurality of samples and the first best fit line function; associating a first one of the digital signals with the first absolute distance; and selectively delaying the first one of the digital signals by a delay time to substantially align the first one of the digital signals with a second one of the digital signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 3A,B-6A,B illustrate timing diagrams and samples obtained during various operations of the process of FIG. 2 in accordance with an embodiment of the present invention.

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, a programmable logic device (PLD) will be utilized to illustrate various techniques in accordance with one or more embodiments of the present invention. However, it should be understood that the techniques disclosed herein may be implemented as desired, in accordance with one or more embodiments of the present invention, with any appropriate hardware or software.

Figure 1:
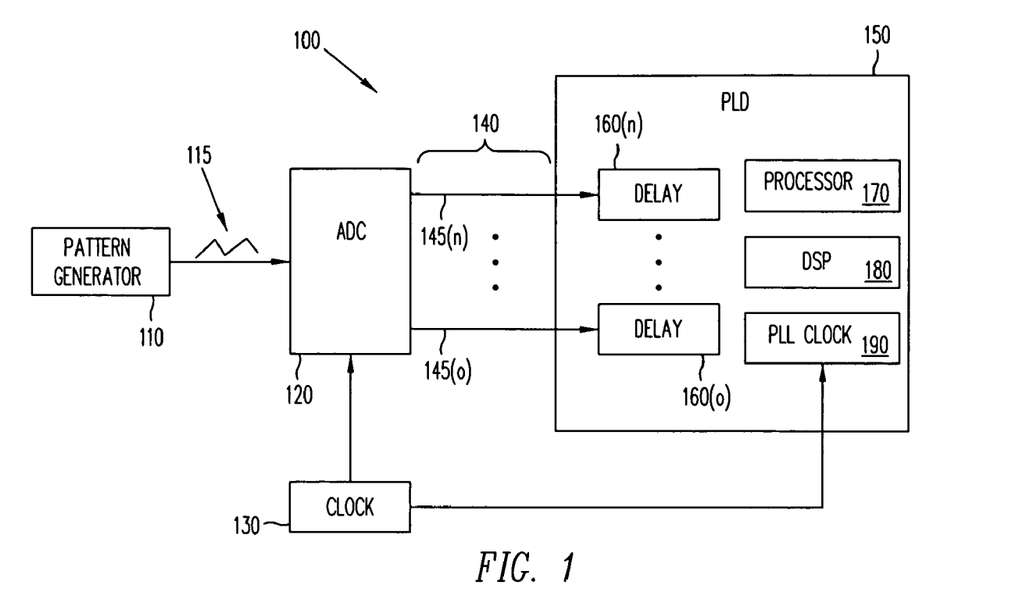
FIG. 1 illustrates a block diagram of a system for aligning a plurality of digital output signals in accordance with an embodiment of the present invention.

FIG. 1 illustrates a block diagram of a system 100 for aligning a plurality of digital output signals in accordance with an embodiment of the present invention. System 100 includes a pattern generator 110, an analog-to-digital converter (ADC) 120, a clock source 130, and a programmable logic device (PLD) 150.

Pattern generator 110 may be configured to provide an analog input signal 115 to ADC. In one embodiment, analog input signal 115 may exhibit a ramp function, however, it will be appreciated that analog input signal 115 may be implemented using any desired waveform.

ADC 120 may be configured to convert analog input signal 115 to a plurality of digital output signals 145 which are provided to PLD 150 over multiple signal paths of a parallel data bus 140. Each of digital output signals 145 may be associated with one data bit. For example, if ADC 120 is implemented as an 8-bit converter, eight digital output signals 145 may be provided over eight signal paths of the data bus. In one embodiment, ADC 120 may be a high speed converter capable of supporting sampling rates in excess of 1.5 GHz, such as an ADC08D1500 converter available from National Semiconductor.

Clock 130 is a calibrated clock source, such as a conventional clock generator, capable of generating one or more reference clock signals to be provided to one or more integrated circuits as understood by persons skilled in the art. As illustrated, synchronous clock signals may be provided to ADC and PLD 150.

PLD 150 may be implemented as any appropriate programmable logic device capable of implementing various features further described herein. For example, in one embodiment, PLD 150 may be implemented as a field programmable gate array (FPGA) or a complex programmable logic device (CPLD).

As illustrated, PLD 150 includes a plurality of delay blocks 160 that are associated with corresponding digital output signals 145. For example, each of delay blocks 160 may be implemented as part of an input buffer of PLD 150 to receive one of digital output signals 145 through associated input pads of PLD 150. Each of delay blocks 160 may have an associated delay time that may be independently adjusted by PLD 150 to compensate for potential misalignment between digital output signals 145 as further described herein. In one embodiment, the delay time of each of delay blocks 160 may be selected in 16 increments of approximately 40 picoseconds each.

As will be understood by those skilled in the art, PLD 150 may be configured (e.g., by loading appropriate configuration data) to implement various logic and processing tasks as may be desired for particular applications. In this regard, PLD 150 may be configured to support a processor block 170 and a DSP block 180. Processor block 170 may operate to perform a process of aligning digital output signals 145 as further described herein. In particular, processor block 170 may operate to independently adjust the individual delay times of delay blocks 160. In one embodiment, processor block 170 may be configured as a Mico8 microcontroller available from Lattice Semiconductor Corporation. DSP block 180 may be implemented to provide any desired logic components (e.g., adders, subtractors, multipliers, counters, state machines, memories, or other components) to be controlled by processor block 170 in order to support the process of aligning digital output signals 145.

PLL clock 190 provides a clock signal which may be synchronized with clock 130. PLD 150 may be configured to sample each of digital output signals 145 via delay blocks 160 in accordance with a rising/falling clock edge of PLL clock 190. As further described herein, rising edge of PLL clock 190 may also be selectively offset by PLD 150 to occur in proximity to the switching times of one or more of digital output signals 145.

Figure 2:
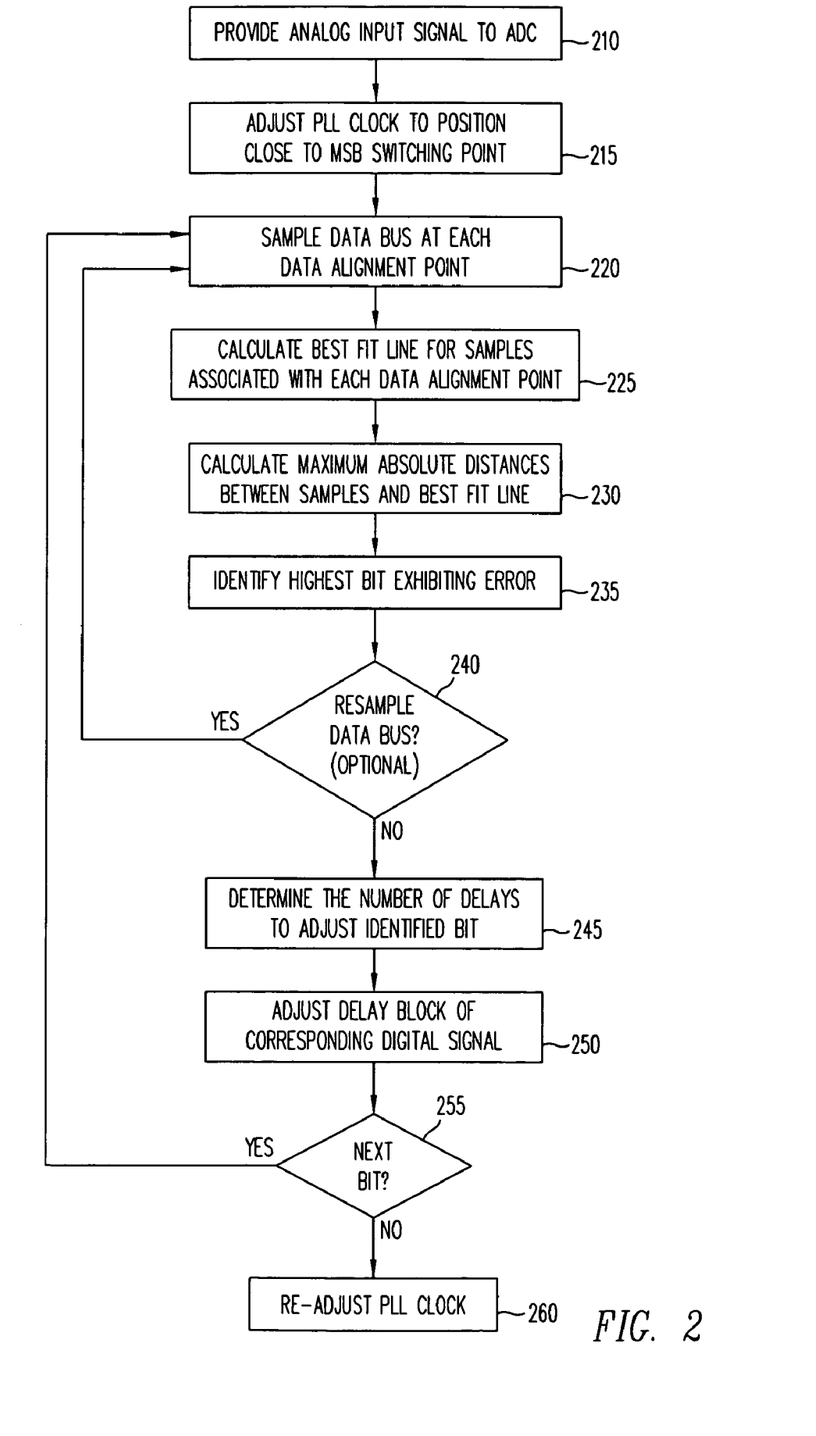
FIG. 2 illustrates a process of aligning a plurality of digital output signals in accordance with an embodiment of the present invention.

It will be appreciated that, depending on the particular layout and implementation of the various components of system 100, digital output signals 145 may incur different propagation delays as they are passed over data bus 140 to PLD 150. As a result, digital output signals 145 may be misaligned with each other when they are received and sampled by PLD 150. Accordingly, FIG. 2 illustrates a process of aligning digital output signals 145 in accordance with an embodiment of the present invention.

At initial operation 210, analog input signal 115 from pattern generator 110 is provided to ADC 120. ADC 120 converts analog input signal 115 into digital output signals 145 that are provided to PLD 150 over data bus 140. As previously discussed, analog input signal 115 may be implemented as a ramp function. It will be appreciated that such an implementation can advantageously provide ADC 120 with a smooth waveform having a steadily increasing amplitude. As a result, digital output signals 145 provided by data bus 140 can provide data values that track the steadily increasing amplitude of analog input signal 115.

In operation 215, PLD 150 adjusts PLL clock 190 to cause a rising edge of PLL clock 190 to occur after the switching point of digital output signals 145 (i.e., the transition between periodic data bit values). For example, in one embodiment, PLL clock 190 may be selectively offset in increments of approximately 22.5 degrees relative to clock 130. As discussed, PLD 150 may be implemented to sample digital output signals 145 of data bus 140 at a rising edge of PLL clock 190. Accordingly, by repeatedly sampling data bus 140 with differing offset values applied to PLL clock 190, PLD 150 may identify a suitable offset (for example, 22.5 degrees or 45 degrees) which will cause the rising edge of PLL clock 190 to occur shortly after each MSB data value is received.

Figures 3A, 3B:
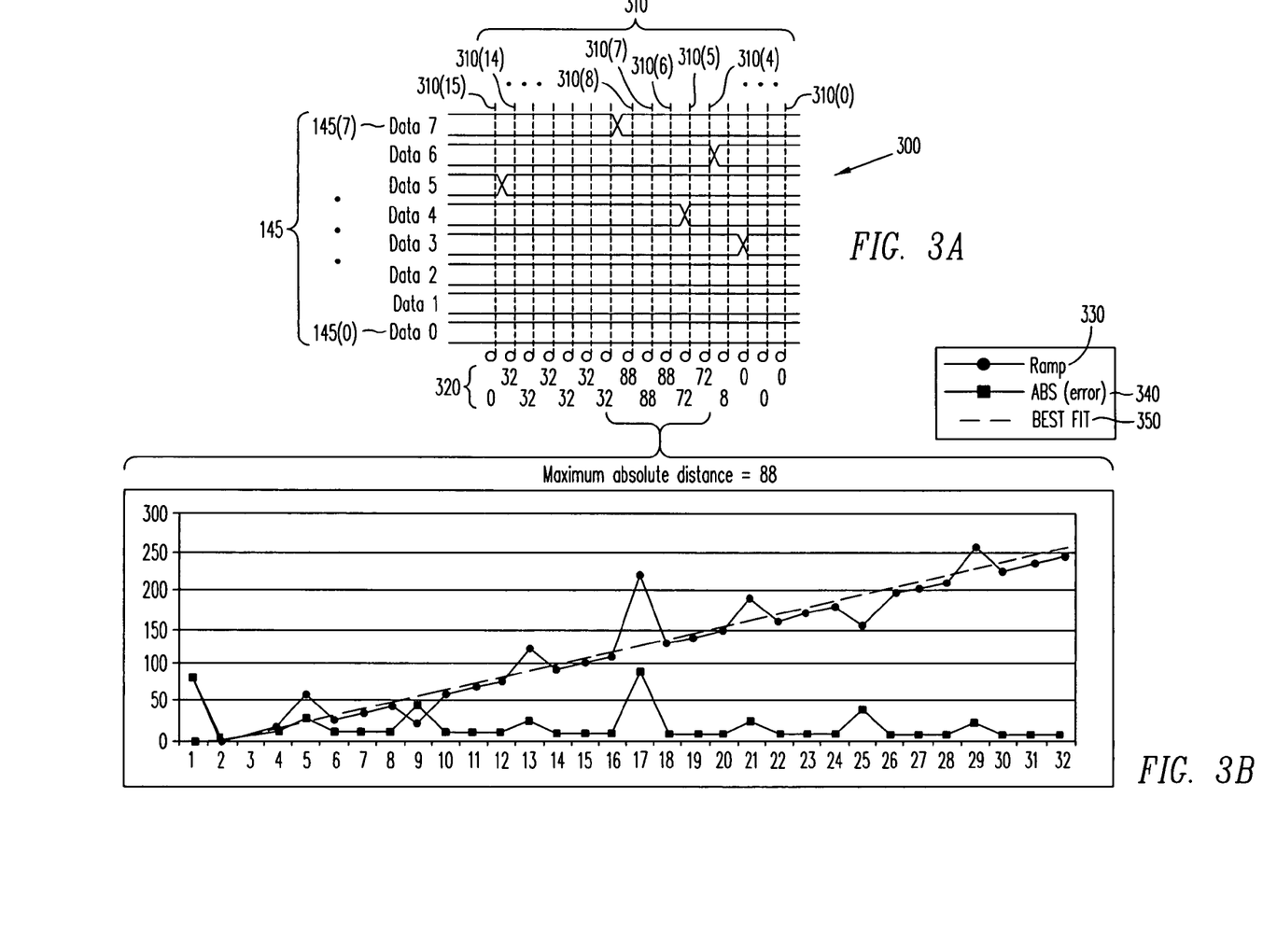

Following the adjustment of PLL clock 190, PLD 150 proceeds to sample data bus 140 at a plurality of data alignment points (operation 220). Operation 220 can be further understood with reference to FIG. 3A. FIG. 3A shows a timing diagram 300 illustrating the relative switching points of digital output signals 145 received by PLD 150. In the embodiment of FIG. 3A, ADC 120 has been implemented as an 8-bit converter providing eight digital output signals 145 (labeled 145(0)-145(7)) associated with eight data bits (labeled Data 0-7, with Data 7 representing the most significant bit). As will be further described herein, digital output signals 145(0)-(2) are not shown in FIG. 3A.

Upon inspection of FIG. 3A, it will be appreciated that digital output signals 145(3)-(6) are misaligned with respect to digital output signal 145(7). For example, digital output signals 145(3)-(4) and 145(6) are shown to lag digital output signal 145(7), which indicates that such signals are received by PLD 150 after digital output signal 145(7). Conversely, digital output signal 145(5) leads digital output signal 145(7), which indicates that it is received by PLD 150 before digital output signal 145(7).

As also illustrated in FIG. 3A, a plurality of data alignment points 310 are shown on timing diagram 300. Each of data alignment points 310 corresponds to an incremental delay setting of delay blocks 160 associated with digital output signals 145 which may be applied to digital output signals 145 while they are sampled by PLD 150. For example, the right-most data alignment point (labeled 310(0)) may correspond to the location at which sampling occurs where no delays have been applied to digital output signals 145. The left-most data alignment point (labeled 310(15)) may correspond to the location at which sampling occurs when digital output signals 145 have been delayed by 15 delay increments.

It will be appreciated that depending on the number of delay increments applied by delay blocks 160 to each digital output signal 145, sampling may occur before or after the switching point of each digital output signal 145. Because each of digital output signals 145 are received by PLD 150 at different times, uniformly delaying digital output signals 145 can cause deviations in the sampled data values of individual digital output signals 145. For example, if sampling occurs at data alignment point 310(8) (i.e., digital output signals 145 have been delayed by 8 delay increments), the value of digital output signal 145(7) will be read correctly because it has switched prior to sampling. However, the value of digital output signal 145(6) may be misread because it will not yet have switched.

Accordingly, in operation 220 of FIG. 2, PLD 150 samples data bus 140 at each of data alignment points 310 for at least one complete period of analog input signal 115. This sampling produces a sample set for each data alignment point 310. For example, FIG. 3B illustrates a set of samples 330 taken for one period of analog input signal 115 at data alignment point 310(8) while analog input signal 115 is implemented as a ramp function.

As shown in FIG. 3B, samples 330 may include 32 individual samples taken at equal intervals during one period of analog input signal 115. Because eight digital output signals 145 are used to represent analog input signal 115, the amplitude of analog input signal 115 may correspond to a range of 0 to 255 steps (i.e., 256 total steps provided by 8 bits).

If no misalignment occurs between digital output signals 145, samples 330 may correspond to 8 step increments in the value of the amplitude of analog input signal 115 (i.e., 256 steps divided by 32 samples where analog input signal 115 is implemented as a ramp function). Accordingly, the three least significant bits of digital output signals 145 (corresponding to amplitude steps in the range of 0 to 7) may be considered within the minimum "slop" (i.e., noise) attainable for the sampling frequency represented in the embodiment of FIG. 3B. As a result, the three least significant digital output signals 145(0)-145(2) are not shown in timing diagram 300. However, it will be appreciated that such signals may be used in embodiments where higher sampling frequencies are used (for example, 256 samples per period of ramp function 115).

Upon inspection of samples 330, it will be appreciated that they do not entirely conform to a ramp function waveform. In particular, deviations from the ramp function can be seen in samples 1, 2, 5, 9, 13, 17, 21, 25, and 29. Such deviations can be caused by, for example, the switching points of various data output signals 145 occurring after data alignment point 310(8). For example, the deviation of sample 1 may be caused by a misalignment of data output signal 145(7) which exhibits a logical high value associated with a previous period of the ramp function (i.e., a "wrap-around" bit error").

In operation 225, PLD 150 calculates a best fit line for the set of samples taken at each of data alignment points 310. It will be appreciated that such a line may be determined in accordance with a function of the form Y=aX+b. In this regard, each of the lines calculated in operation 225 may have substantially the same slope "a" corresponding to the slope of a ramp function of analog input signal 115, but may have differing offset values "b" depending on the timing of the first sample in each set. For example, FIG. 3B illustrates a best fit line 350 calculated for the set of samples taken at data alignment point 310(8). In the embodiment of FIG. 3B, best fit line 350 exhibits a slope value of 8 (i.e., 256 amplitude steps divided by 32 samples).

In operation 230, PLD 150 calculates the maximum absolute distance between the samples taken in operation 220 and the best fit line determined in operation 225 for each of data alignment points 310. For example, in FIG. 3B, an absolute distance plot 340 is provided which identifies the absolute distances between samples 330 and best fit line 350. As will be apparent from FIG. 3B, the maximum absolute distance between samples 330 and best fit line 350 occurs at samples 1 and 17 wherein best fit line 350 and each of samples 1 and 17 exhibit an absolute difference of 88. FIG. 3A also illustrates a plurality of maximum absolute distances 320 which have been calculated for the remaining data alignment points 310. For example, the maximum absolute distance between samples taken at data alignment point 310(14) is 32.

In operation 235, PLD 150 identifies the highest data bit exhibiting a deviation in the various sample sets. In this regard, it will be appreciated that maximum absolute distances 320 can be correlated to particular data bits and corresponding digital output signals 145. For example, a maximum absolute distance that falls within the range of $2^n$ and $2^{(n+1)}-1$ can be attributed to a deviation in the nth data bit (where zero is the least significant bit) corresponding to digital output signal 145(n).

Accordingly, in the example of FIG. 3A, the maximum absolute distance is 88, which occurs in the sample sets for data alignment points 310(6), 310(7), and 310(8). As a result, the highest data bit exhibiting a deviation is data bit 6 (i.e., 88 is in the range of $2^6=64$ and $2^7-1=127$).

In operation 240, PLD 150 may optionally choose to repeat operations 220 through 235 one or more times in order to perform another identification of the highest data bit exhibiting a deviation. It will be appreciated that by repeating these operations, deviations attributable to noise in digital output signals 145 may be minimized and the highest data bit exhibiting a deviation may be determined with greater confidence. For example, in one embodiment, PLD 150 may choose to repeat operations 220 through 235 until a particular data bit is consistently identified in at least 50% of the iterations of operations 220 through 235.

In operation 245, PLD 150 determines a number of delay increments in which to shift the particular digital output signal 145 associated with the data bit previously identified in operation 235. In one embodiment, the number of delay increments can be selected in accordance with the number of data alignment points 310 exhibiting maximum absolute distances attributable to the particular identified bit. For example, in the embodiment of FIG. 3A, five data alignment points (i.e., 310(4), 310(5), 310(6), 310(7), and 310(8)) exhibit maximum absolute distances in the range of 64 and 127 which are attributable to data bit 6. Accordingly, digital output signal 145(6) associated with data bit 6 may be adjusted by five delay increments in the direction of the switching point of digital output signal 146(7) (i.e., the most significant bit). As a result, in operation 250, PLD 150 adjusts the corresponding delay block 160 associated with digital output signal 145(6) in accordance with the number of delays selected in previous operation 245 (i.e., five delay increments).

In timing diagram 300 of FIG. 3A, it will be appreciated that other data alignment points 310 exhibit maximum absolute distances 320 attributable to deviations in other data bits. For example, the identified maximum absolute distances of 32 and 8 indicate that digital output signals 145(5) and 145(3), respectively, are also misaligned. Accordingly, if any additional data bits remain to be adjusted (operation 255), then the process of FIG. 2 returns to operation 220.

Figures 4A, 4B:
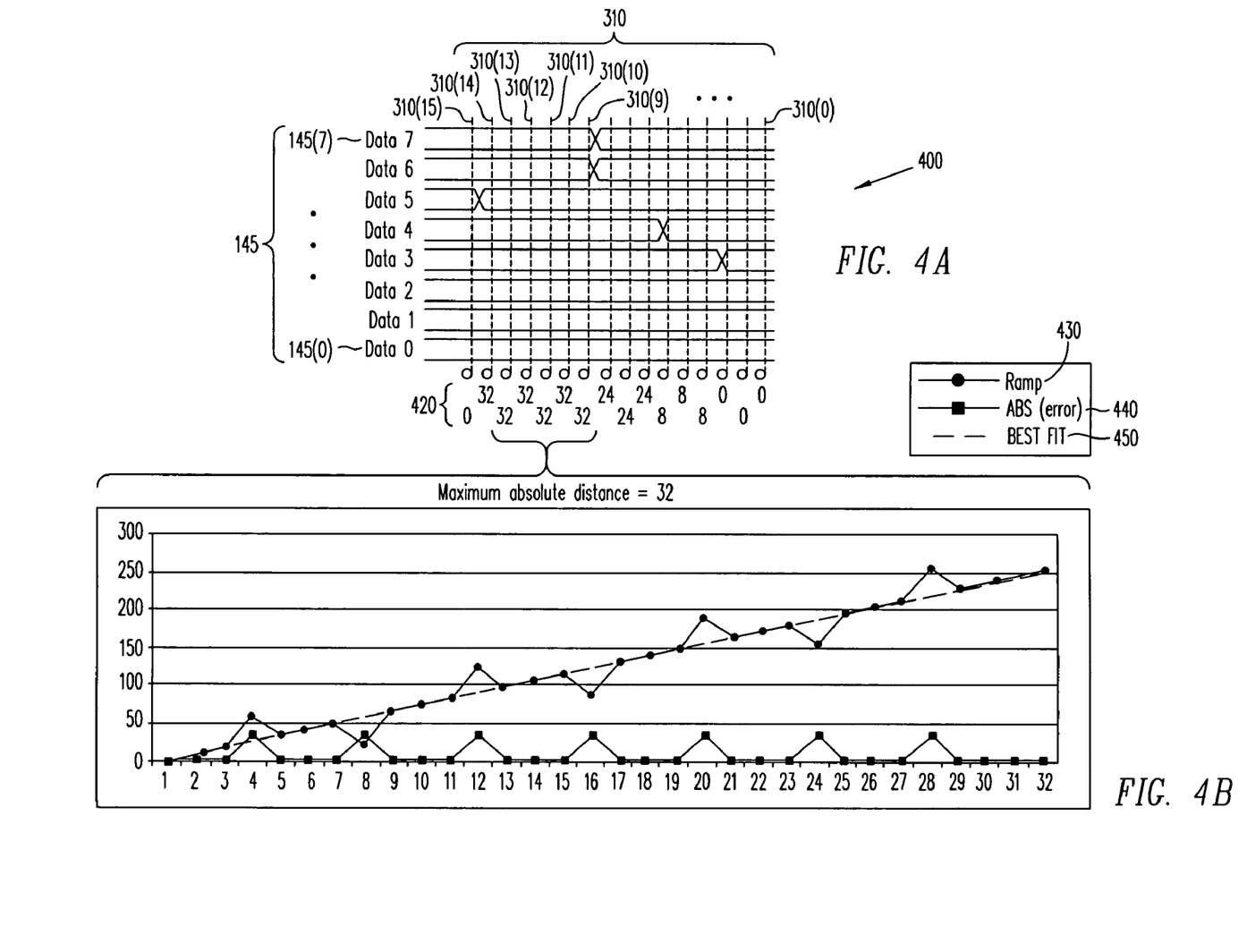

FIG. 4A shows a timing diagram 400 illustrating the relative positions of digital output signals 145 received by PLD 150 after operation 250 has been performed for delay block 160 associated with digital output signal 145(6). Upon inspection of FIG. 4A, it will be appreciated that digital output signal 145(6) has been shifted five delay increments (corresponding to five data alignment points) to become substantially aligned with digital output signal 145(7) as a result of the delay introduced by the corresponding delay block 160 in operation 250. However, it will also be appreciated that digital output signals 145(3)-(5) remain misaligned. Operations 220 through 250 may be repeated with respect to remaining digital output signals 145(3)-(5) without making further adjustments to the delays associated with previously aligned digital output signals 145(6)-(7).

For example, FIG. 4B further illustrates a set of samples 430 taken for one period of analog input signal 115 at data alignment point 310(12), a best fit line 450 calculated for samples 430, and an absolute distance plot 440 which identifies the absolute distances between samples 430 and best fit line 450 (operations 220 through 230). In the embodiment of FIG. 4A, the greatest maximum absolute distances occur at each of data alignment points 310(9) through 310(14). As a result, the highest data bit exhibiting a deviation is data bit 5 (i.e., 32 is in the range of $2^5=32$ and $2^6-1=63$) (operations 235 and 240). Because six data alignment points exhibit a maximum absolute attributable to data bit 5 (operation 245), the delay setting of the corresponding delay block 160 associated with bit number 5 may be adjusted by six delay increments in the direction of the switching point of digital output signal 145(7). In this regard, it will be appreciated that the delay block 160 associated with data bit 7 may be set to an intermediate number of delay increments (e.g., nine delay increments) to permit the remaining data bits 0-6 to be individually adjusted forward and backward relative to data bit 7.

Figures 5A, 5B:
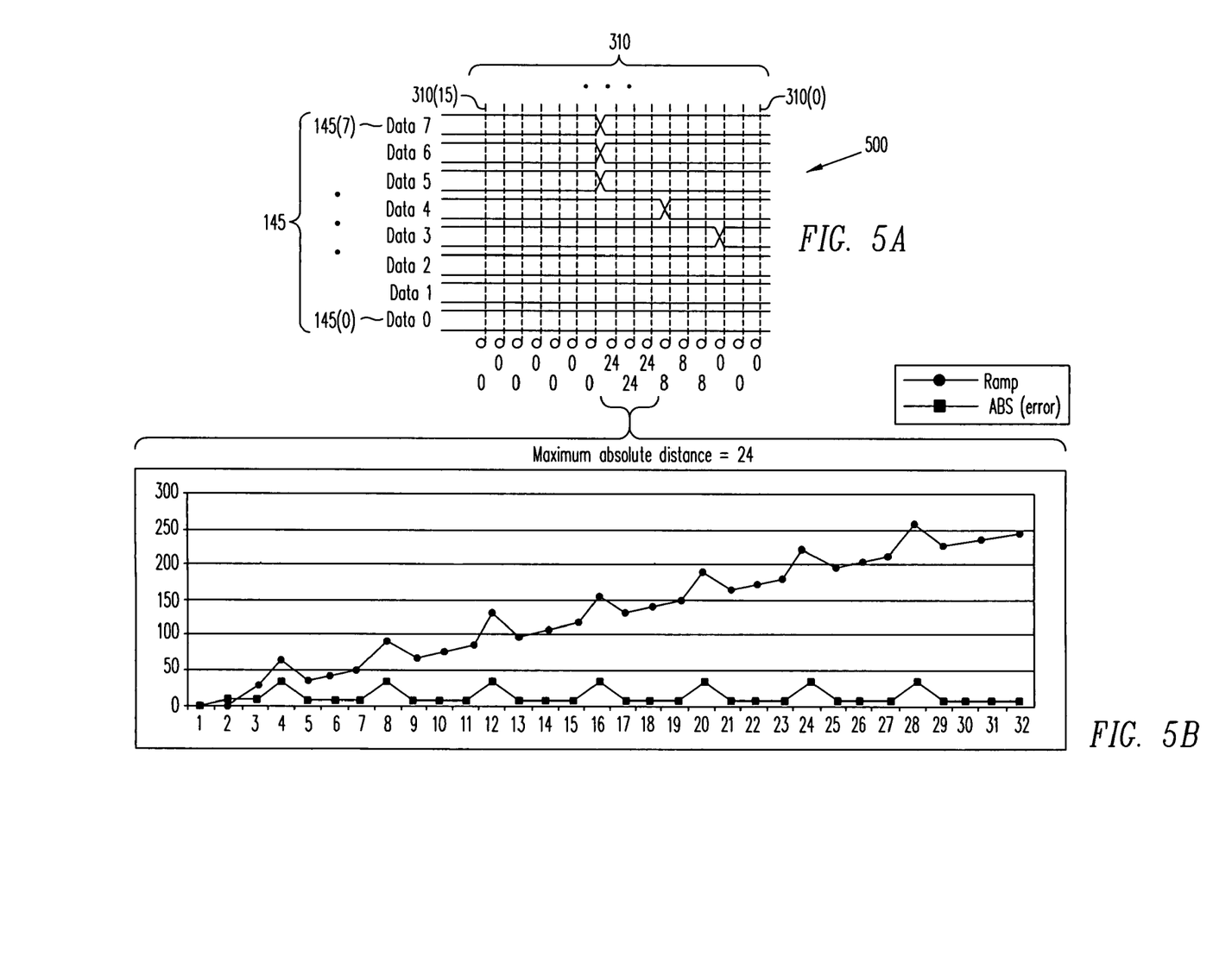
Figures 6A, 6B:
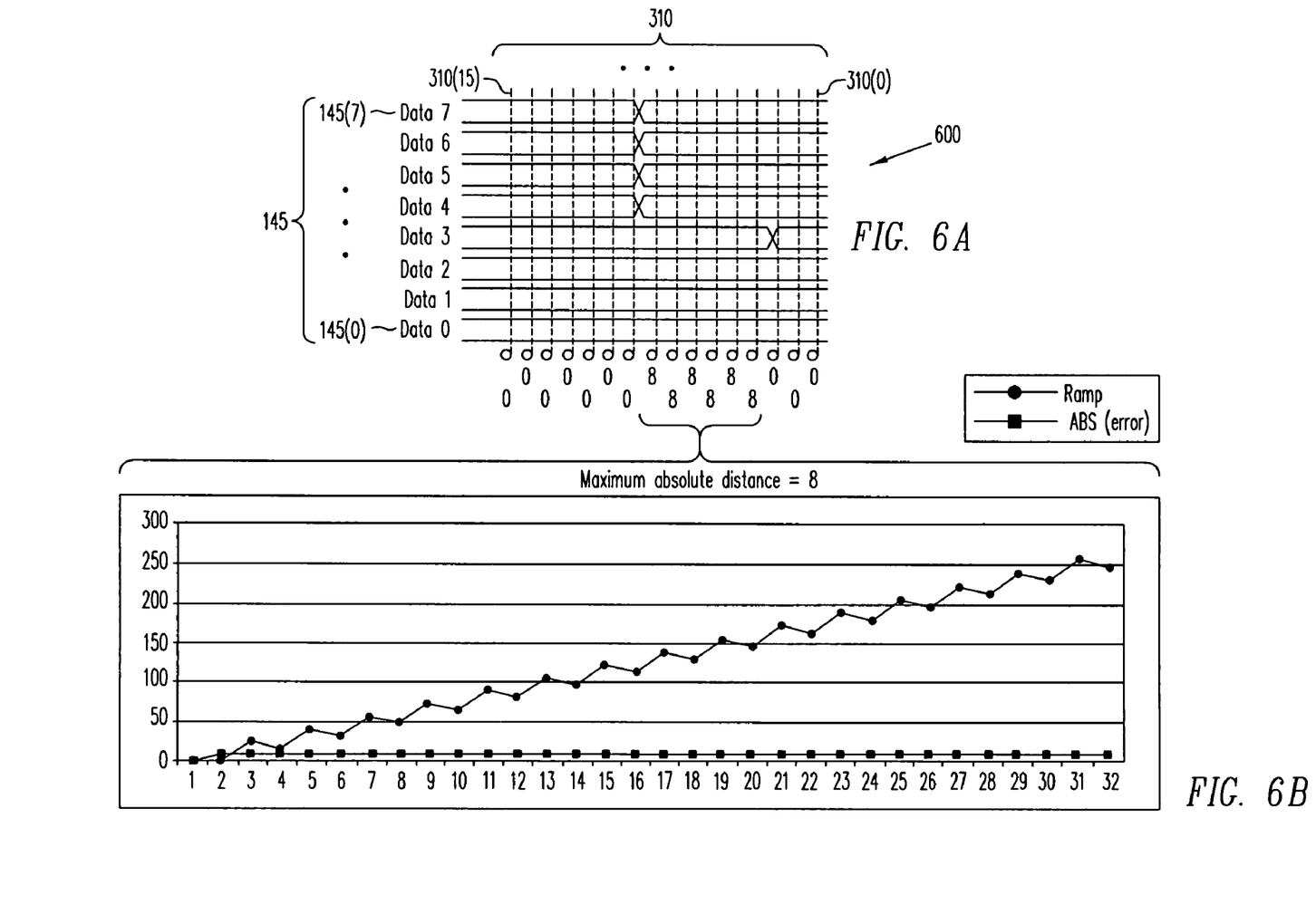

FIGS. 5A and 6A show timing diagrams 500 and 600, respectively, illustrating relative positions of digital output signals 145 received by PLD 150 for subsequent iterations of operations 220 through 250. For example, in timing diagram 500, digital output signal 145(5) is illustrated as being shifted into alignment with digital output signals 145(6) and 145(7). In timing diagram 600, digital output signal 145(4) is illustrated as being shifted into alignment with digital output signals 145(5)-(7). Similarly to FIGS. 3B and 4B, FIGS. 5B and 6B each illustrate a set of samples taken for one period of the analog input signal 115 at one of the data alignment points.

It will be appreciated that PLD 150 may continue to repeat operations 220 through 250 until all of digital output signals 145(3)-(7) are aligned. It will be further appreciated that for embodiments utilizing higher sampling frequencies, additional digital output signals 145(0)-(2) may also be aligned. If no additional digital output signals 145 remain to be aligned (operation 255), then PLL clock 190 may be readjusted (operation 260) to the center of the sampling period of PLD 150 (e.g., at approximately 90 degrees or approximately 180 degrees relative to the switching points of data input signals 145).

Figure 7:
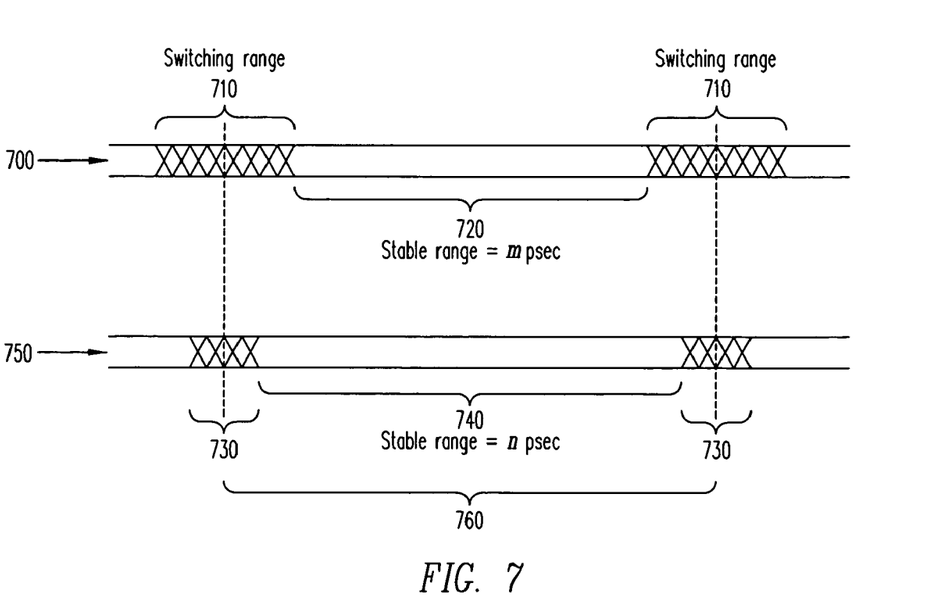
FIG. 7 illustrates timing diagrams showing alignment of digital output signals prior to and following the process of FIG. 2 in accordance with an embodiment of the present invention.

FIG. 7 illustrates timing diagrams 700 and 750 showing the alignment of digital output signals 145 as received by PLD 150 prior to and following the process of FIG. 2, respectively, in accordance with an embodiment of the present invention. As shown in FIG. 7, data values of digital output signals 145 change with a period 760. Switching points of digital output signals 145 occur within a switching range 710 prior to the process of FIG. 2, which leaves a window 720 having a stable range of m picoseconds during which PLD 150 may sample data bus 140. However, following the process of FIG. 2, digital output signals 145 exhibit a smaller switching range 730 which provides a larger window 740 having a larger stable range of n picoseconds during which PLD 150 may sample data bus 140. It will be appreciated period 760 may be shortened by n-m picoseconds, thereby permitting PLD 150 to sample data bus 140 at higher frequencies.

In view of the present disclosure, it will be appreciated that an integrated circuit implemented in accordance with one or more embodiments provided herein can effectively align one or more periodic digital output signals received from an ADC. As a result, a greater sampling window can be made available for reliable sampling of an ADC data bus. In addition, because portions of the sampling window previously consumed by misalignment of digital output signals can be eliminated, the size of the sampling window can be reduced by a corresponding amount to permit an increase in the effective sampling frequency of the integrated circuit.

Embodiments described above illustrate but do not limit the invention. It should also be understood that numerous modifications and variations are possible in accordance with the principles of the present invention. In particular, it is contemplated that portions of the various embodiments described herein in terms of software (e.g., processor block 170 and DSP 180) may be implemented as hardware, and vice-versa. Accordingly, the scope of the invention is defined only by the following claims.

We claim:

1. A method of aligning digital signals appearing on signal paths of a parallel data bus, the method comprising:
    sampling the digital signals at a plurality of delay times to obtain a plurality of sample sets, wherein each sample set is associated with a corresponding delay time;
    identifying from the sample sets a second digital signal that is misaligned with respect to a first digital signal, wherein the identifying further comprises:
        determining a best fit line function for each sample set;
        calculating an absolute distance between the best fit line function and samples within the associated sample set; and
        identifying from the calculated absolute distances a data signal having the highest data bit exhibiting a deviation from the best fit line function;
    determining the delay time required to align the second digital signal with the first digital signal; and
    adjusting the delay of the second digital signal by the determined delay time.

2. The method of claim 1, wherein the first digital signal represents the most significant bit of multi-bit data appearing on the data bus.

3. The method of claim 1, wherein the delay time is determined by the number of the sample sets having the highest data bit exhibiting a deviation from a best fit line function.

4. The method of claim 1, further comprising repeating the method to substantially align a third digital signal provided by the data bus with the first and second digital signals.

5. The method of claim 1, wherein the digital signals are received from an analog-to-digital converter (ADC).

6. The method of claim 5, further comprising providing a ramp function to the ADC.

7. The method of claim 1, wherein the method is performed by a programmable logic device (PLD).

8. A system for aligning a plurality of signals, the system comprising:
   a plurality of input buffers adapted to receive a plurality of digital signals over a data bus, wherein the digital signals are associated with a corresponding plurality of data bits;
   a plurality of delay blocks associated with the input buffers, wherein each delay block is adapted to individually delay an associated one of the digital signals by a selectable delay time; and
   means for selecting the delay times of the delay blocks to substantially align the digital signals, wherein the input buffers, the delay blocks, and the selecting means are implemented by a programmable logic device (PLD).

9. The system of claim 8, further comprising:
   a pattern generator adapted to provide an analog signal; and
   an analog-to-digital converter (ADC) adapted to convert the analog signal to the digital signals.

10. The system of claim 8, wherein the selecting means further comprises:
    means for sampling the digital signals to obtain a plurality of samples;
    means for determining a best fit line function using the samples;
    means for calculating an absolute distance between the plurality of samples and the best fit line function;
    means for associating at least one of the digital signals with the absolute distance; and
    means for selecting the delay time of the delay block associated with the at least one of the digital signals using the absolute distance.

11. A method of aligning a plurality of signals, the method comprising:
    sampling a plurality of digital signals to obtain a first plurality of samples, wherein the digital signals are associated with a corresponding plurality of data bits;
    determining a first best fit line function using the first plurality of samples;
    calculating a first absolute distance between the first plurality of samples and the first best fit line function;
    associating a first one of the digital signals with the first absolute distance; and
    selectively delaying the first one of the digital signals by a delay time to substantially align the first one of the digital signals with a second one of the digital signals.

12. The method of claim 11, further comprising:
    sampling the digital signals to obtain a second plurality of samples;
    determining a second best fit line function using the second plurality of samples; and
    calculating a second absolute distance between the second plurality of samples and the second best fit line function, wherein the first absolute distance is greater than the second absolute distance.

13. The method of claim 11, further comprising repeating the method to substantially align a third one of the digital signals with the first and second digital signals.

14. The method of claim 11, wherein the second one of the digital signals is associated with a most significant bit of a data bus.

15. The method of claim 11, wherein the digital signals are provided by an analog-to-digital converter (ADC) receiving an analog input signal.

16. The method of claim 15, wherein the analog input signal is a ramp function.

17. The method of claim 11, wherein the sampling is performed at a rate in excess of approximately 1.5 GHz.

18. The method of claim 11, wherein the method is performed by a programmable logic device (PLD).

* * * * *